United States Patent
Khanna et al.

(10) Patent No.: US 7,667,969 B2
(45) Date of Patent: Feb. 23, 2010

(54) PUMP STRUCTURES INTEGRAL TO A FLUID FILLED HEAT TRANSFER APPARATUS

(75) Inventors: Vijayeshwar D. Khanna, Millwood, NY (US); Gerard McVicker, Stormville, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/686,972

(22) Filed: Mar. 16, 2007

(65) Prior Publication Data

US 2008/0225488 A1    Sep. 18, 2008

(51) Int. Cl.
 *H05K 7/20* (2006.01)
(52) U.S. Cl. .................. 361/699; 165/80.4; 417/424.1; 257/714
(58) Field of Classification Search .................. 361/697, 361/699, 695; 165/80.4, 104.33; 257/714, 257/E23.098
See application file for complete search history.

(56) References Cited

U.S. PATENT DOCUMENTS

| | | | |
|---|---|---|---|
| 6,019,165 A * | 2/2000 | Batchelder | 165/80.3 |
| 6,377,458 B1 | 4/2002 | Morris et al. | |
| 6,408,937 B1 * | 6/2002 | Roy | 165/104.33 |
| 6,507,492 B2 | 1/2003 | Morris et al. | |
| 6,580,610 B2 | 6/2003 | Morris et al. | |
| 6,785,134 B2 * | 8/2004 | Maveety et al. | 361/699 |
| 6,809,928 B2 | 10/2004 | Gwin et al. | |
| 6,876,550 B2 | 4/2005 | Sri-Jayantha et al. | |
| 6,952,346 B2 * | 10/2005 | Tilton et al. | 361/699 |
| 7,249,625 B2 * | 7/2007 | Duan | 165/80.4 |
| 7,262,967 B2 * | 8/2007 | Crocker et al. | 361/699 |
| 7,274,566 B2 * | 9/2007 | Campbell et al. | 361/699 |
| 2004/0052048 A1 | 3/2004 | Wu et al. | |
| 2004/0114327 A1 | 6/2004 | Sri-Jayantha et al. | |
| 2004/0125561 A1 | 7/2004 | Gwin et al. | |
| 2004/0130874 A1 * | 7/2004 | Maveety et al. | 361/699 |
| 2005/0024830 A1 | 2/2005 | Lee et al. | |
| 2005/0068725 A1 | 3/2005 | Houle et al. | |
| 2005/0185378 A1 * | 8/2005 | Tilton et al. | 361/699 |
| 2007/0103869 A1 * | 5/2007 | Liu et al. | 361/699 |
| 2007/0262286 A1 * | 11/2007 | Chang et al. | 252/75 |

* cited by examiner

*Primary Examiner*—Jayprakash N Gandhi
*Assistant Examiner*—Courtney Smith
(74) *Attorney, Agent, or Firm*—Scully, Scott, Murphy & Presser, P.C.

(57) ABSTRACT

Presented is a heat sink arrangement, incorporating a fluid media, which transfers heat between stationary and movable objects. Included are pump structures which are designed to be or operate integrally with the fluid-filled heat transfer apparatus, and are adapted to provide optimum and unique cooling flow paths for implementing the cooling of electronic devices, such as computer chips or the like, that require active cooling action. The pumps and heat sink arrangements selectively possess either rotating or stationary shafts, various types of impeller and fluid or cooling media circulation structures, which maximize both the convective and conductive cooling of the various components of the electronic devices or equipment by means of the circulating fluid.

13 Claims, 8 Drawing Sheets

Total Velocity Field (3000 RPM) 0.5 mm Fluid film Gap

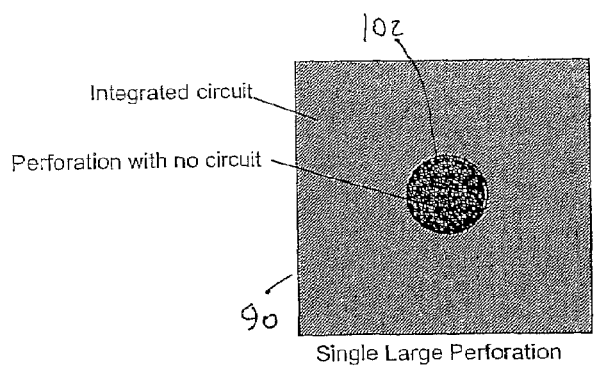
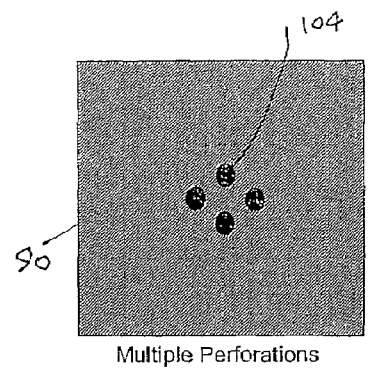
FIG. 16a          FIG. 16b
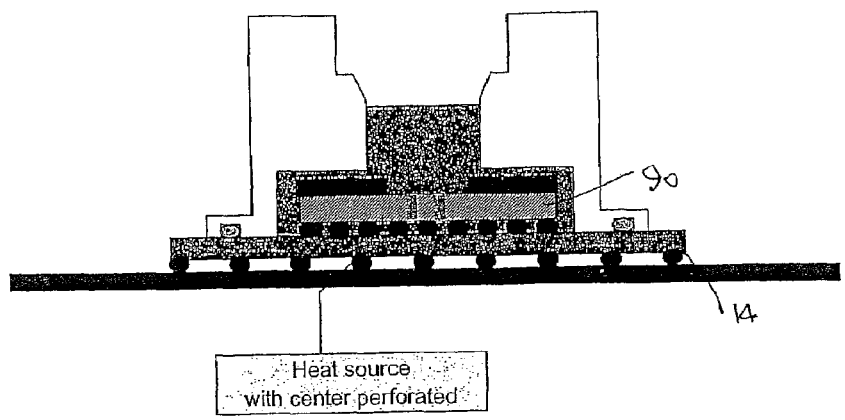
FIG. 17
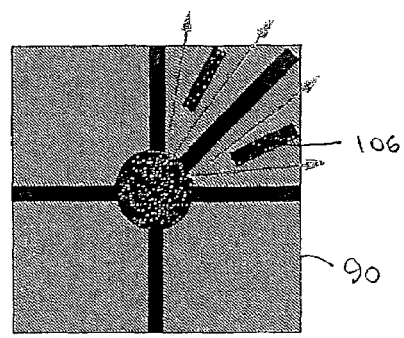
FIG. 18

PUMP STRUCTURES INTEGRAL TO A FLUID FILLED HEAT TRANSFER APPARATUS

BACKGROUND OF THE INVENTION

1. Field of the Invention

The present invention relates to a heat sink arrangement comprising a fluid media, which transfers heat between stationary and movable objects. More particularly, the present invention relates to pump structures which are designed to be or operate integrally with the fluid-filled heat transfer apparatus, and are adapted to provide optimum and unique cooling flow paths for implementing the cooling of electronic devices, such as computer chips or the like, that require active cooling action.

2. Discussion of the Prior Art

In particular, pursuant the prior art, as represented by Sri-Jayantha, et al, U.S. Patent Publication 2004/0114327 A1, and U.S. Pat. No. 6,876,550 B2, the latter of which issued on that particular patent publication, each illustrate active heat sinks for high power microprocessors, and which incorporate structures possessing both static and dynamic components. Essentially, in each instance, the structure incorporates a thermal interface material (TIM), which facilitates the conduction of heat from a first modular component to a further component, while concurrently absorbing or compensating for thermally induced variations in the clearances that are present between the operative or structural components. In particular, the prior art, as represented hereinabove, discloses the concept of a kinetic heat sink, in which a rigid heat spreader supports a fluid film on one side thereof and provides a conductive path from a computer chip to the heat spreader through a thermal interface material. There is no disclosure of utilizing the fluid film as an asset for convecting heat to the remaining surfaces of the prior art heat sink system.

Various other prior art publications relate to diverse types of structures and systems for transmitting fluids or the like, in order to be able to effectuate the cooling of various electronic devices and components.

Houle, et al., U.S. Patent Publication No. 2005/0068725 A1 disclose a thermal transfer system and method for a self-contained closed-loop microchannel cooling arrangement integrated into a micro-component package. However, the system, as disclosed in this publication, which employs fins for conducting heat from heat-generating components to the surroundings, does not provide for the type of pumping structures analogous with that employed in the present invention for attaining highly efficient flow patterns able to adequately cool the various components.

Lee, et al., U.S. Patent Publication No. 2005/0024830 A1 discloses a liquid-cooled heat sink assembly utilizing an impeller, and which also does not, in any manner, describe nor even suggest the unique pumping structure for cooling media pursuant to the present invention.

Gwin, et al., U.S. Patent Publication No. 2004/0125561 A1, disclose a sealed and pressurized liquid cooling arrangement for a microprocessor which, however, does not provide for an optimized heat transfer in both convection and conduction modes pursuant to the present invention.

Similarly, representing primarily technological background disclosures, Wu, et al, U.S. Patent Publication No. 2004/0052048 A1; Morris, et al., U.S. Pat. No. 6,580,610 B2; Morris, et al., U.S. Pat. No. 6,507,492 B2; Gwin, et al., U.S. Pat. No. 6,890,928 B2, which issued on previously mentioned U.S. Patent Publication No. 2004/0125561A1; and Morris, et al., U.S. Pat. No. 6,377,458 B1 are all limited to various types of systems, which are utilized for cooling the operative and heat-generating components of electronic devices or computer chips, but wherein the systems do not incorporate the type of heat transfer apparatus employing pump structures which are integral to the fluid field components of the heat transfer apparatus in order to obtain maximum or optimized degrees of cooling effects due to both the convection and conduction of heat through and away from the confines of the equipment, which is being cooled.

SUMMARY OF THE INVENTION

Accordingly, pursuant to the invention, there is provided a novel pumping structure facilitating the incorporating of all possible types of optimized cooling flow paths for effectuating the proficient cooling of a computer chip or other electronic devices, which necessitates the interposition of an active cooling system.

In essence, the implementation of fluid dynamics analysis provides a clear indication that a thin film of a fluid of preferably less than 1 mm thickness, which is trapped between a rotating cylinder and a stationary cylinder, is imbued with a specific flow pattern. The face of the rotating cylinder, i.e., the normally disk-like portion, creates a centrifugal force acting on the fluid in closer proximity to its surface, and which forces the fluid to flow radially outwardly at a certain velocity. Inasmuch as the radius of the cylinder is finite and the mass of the fluid is conserved, there is resultingly encountered a return or centripetal radial velocity of the fluid along the stationary portion of the external cylinder. This flow in the fluid film offers an opportunity for enhancing the convective heat transfer. With the centrifugal action being limited to the fluid film, that comes into contact with the rotating cylinder surface, it becomes necessary to actively produce a pumping action in order to enhance or augment the fluid flow and hence the convective heat transfer of the cooling system.

In order to effectuate the foregoing, pursuant to the present invention, there are provided various types of fluid pumping arrangements, which are operatively located integral to the heat sink and adjacent the electronic device, such as computer chips or the like, which require the application of an optimized cooling action or effect in order to maintain the components which are being cooled at their highest degree of operating efficiencies.

Accordingly, in order to be able to achieve the foregoing advantages of an optimized cooling and high heat transfer degrees of efficiency in a heat transfer apparatus pursuant to the invention, it is an object to provide unique and highly diverse variations in pump structures, which are integral to the concept of employing a fluid-filled heat transfer apparatus, particularly in the utilization of cooling systems for computer chips or other electronic devices which necessitate maximum degrees of cooling during the operation thereof in order to achieve a lengthy and reliable service life for the electronic devices.

Furthermore, it is another object of the present invention to provide an availability of diverse and unique types of pumps and heat sink arrangements possessing both rotating and stationary shafts, various types of impeller and fluid or cooling media circulation structures, which propagate both the convective and conductive cooling of the various components of the electronic devices or equipment by means of a fluid-filled heat transfer apparatus and unique pump structures.

BRIEF DESCRIPTION OF THE DRAWINGS

Reference may now be made to the following detailed description of various and generally diverse types of pump structures, which are integral to a fluid filled heat transfer apparatus and the components thereof, taken in conjunction with the accompanying drawings, in which:

FIGS. 16(a) and 16(b) illustrate, respectively, various types of perforations formed in a heat generating chip as utilized in the structure of FIG. 15;

FIG. 17 illustrates a pump structure including radial fins employed for heat transfer with an integrated pump; and FIG. 18 illustrates, on an enlarged scale, the partial perforation of the computer chip employed in FIG. 17.

DETAILED DESCRIPTION OF THE PREFERRED EMBODIMENTS

One arrangement for providing active cooling action is the kinetic heat sink (KHS). In kinetic heat sinks, a stationary structure is placed in intimate contact with the electronic device and conducts heat away from said device. The heat is then transferred via a fluid interface to a rotating structure where it is dissipated into the cooling medium. The basic concept of providing kinetic heat sinks for high power microprocessors which incorporate heat transfer configurations in the embodiment of a rotating fin structure or through the intermediary of a heat transfer apparatus containing a compliant fluid film interface is already known in the present state-of-the-technology.

Referring in particular detail to the various heat sink structures shown in FIGS. 1-4 of the drawings, these illustrate the prior art static and dynamic heat sink structures and pumps, as represented in Sri-Jayantha, et al., U.S. Patent Publication No. 2004/0114327A1 and U.S. Pat. No. 6,876,550 B2.

Figure 1:
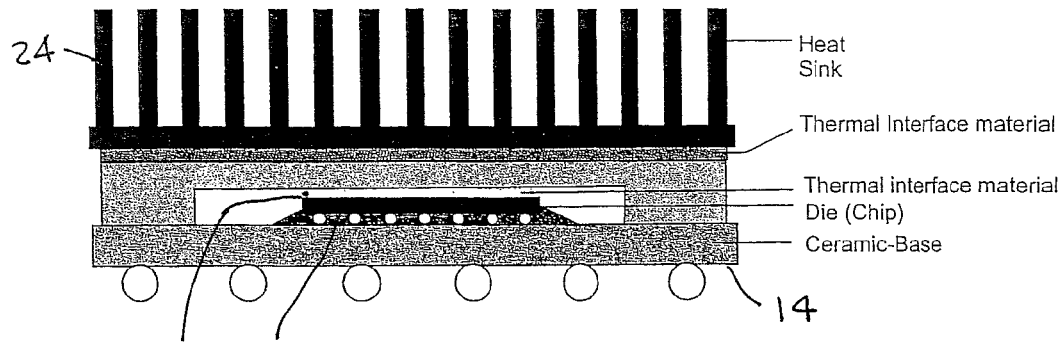
FIG. 1 diagrammatically illustrates a heat sink for high power microprocessors pursuant to the prior art utilizing heat sink fin structures pursuant to the prior art.
Figure 2:
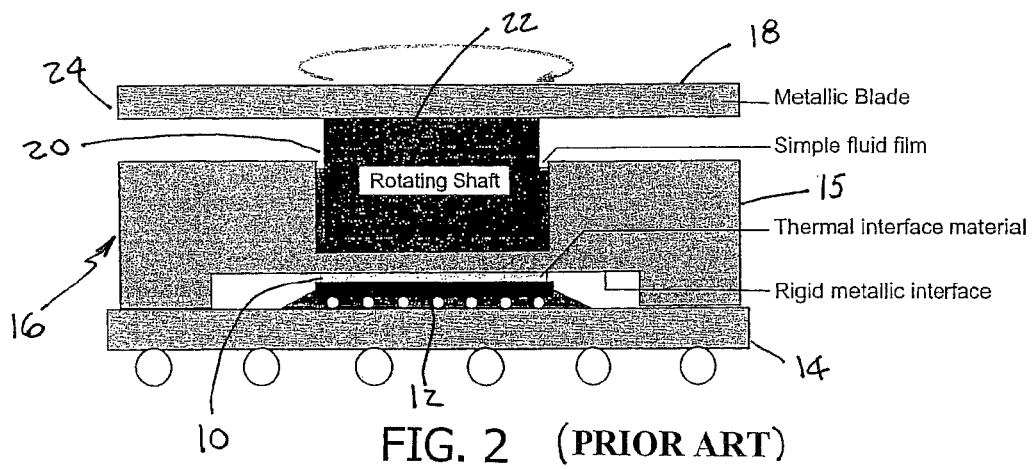
FIG. 2 illustrates a kinetic heat sink with a fluid dynamic bearing as represented in the prior art.
Figure 3:
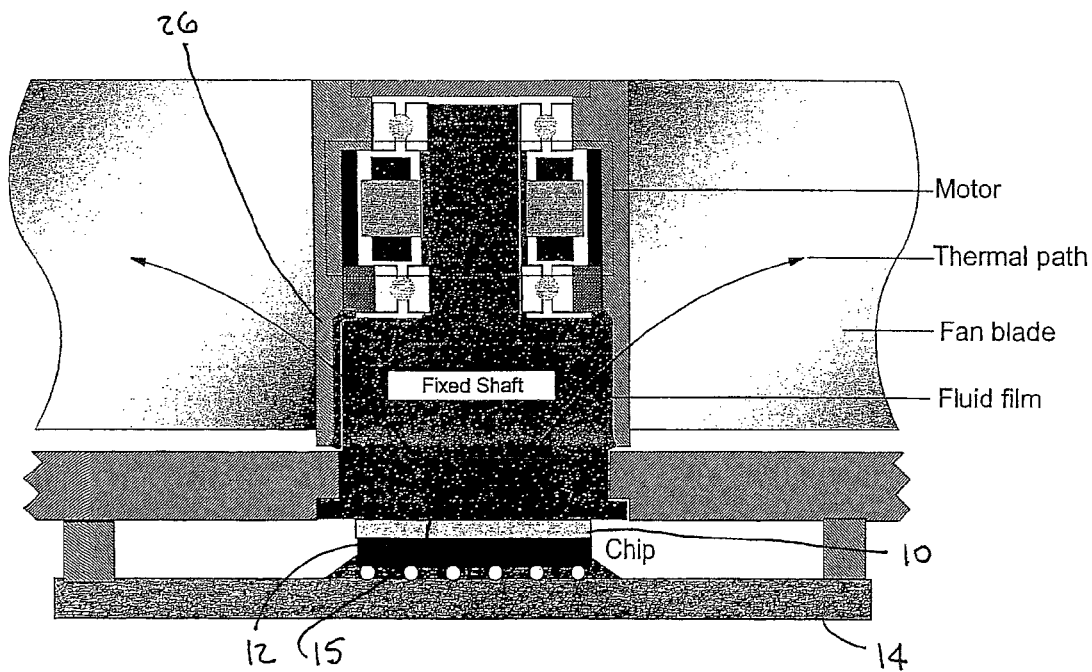
FIG. 3 illustrates a kinetic heat sink incorporating a fixed or stationary center shaft structure pursuant to the prior art.
Figure 4:
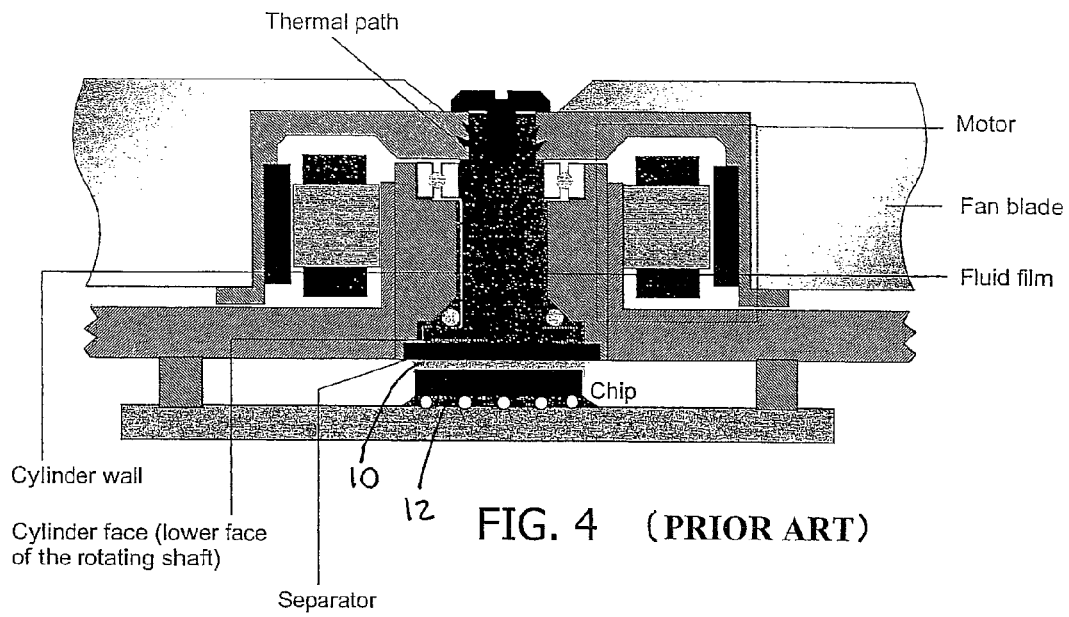
FIG. 4 illustrates an embodiment of a kinetic heat sink with a rotating center shaft pursuant to the prior art.

In particular, as illustrated in these known embodiments, the structures generally disclose a thermal interface material (TIM) 10, which facilitates a heat conduction from one modular component, such as a chip or die 12, to a heat spreader 15, while absorbing or compensating for a thermally-induced variation in clearances between the components, as in FIG. 1. FIG. 2 shows a kinetic heat sink (KHS) 16 where a rigid heat spreader 15 supports a fluid film 20 on one side and provides a thermal conduction path from the chip 12 to itself through a TIM 10. This prior art does not envisage using the fluid film 20 as an asset for convecting heat to any remaining surfaces of the heat sink system. A rotating shaft 22 is encompassed by the fluid film 20, and supports a metallic blade 24 providing a heat sink arrangement. FIGS. 3 and 4 show variations in the prior art corresponding to FIG. 2. In each configuration, the method of supporting a rotational blade is varied, wherein FIG. 3, a fixed center shaft is employed. The heat flux from a source is conducted through a TIM to a fixed shaft 26, wherein the shaft diameter is optimized for maximum surface area providing for heat conduction, while constituting a structure for supporting the rotatable components. As previously mentioned, all of these features and arrangements are disclosed in the above-referenced publications.

Figure 5:
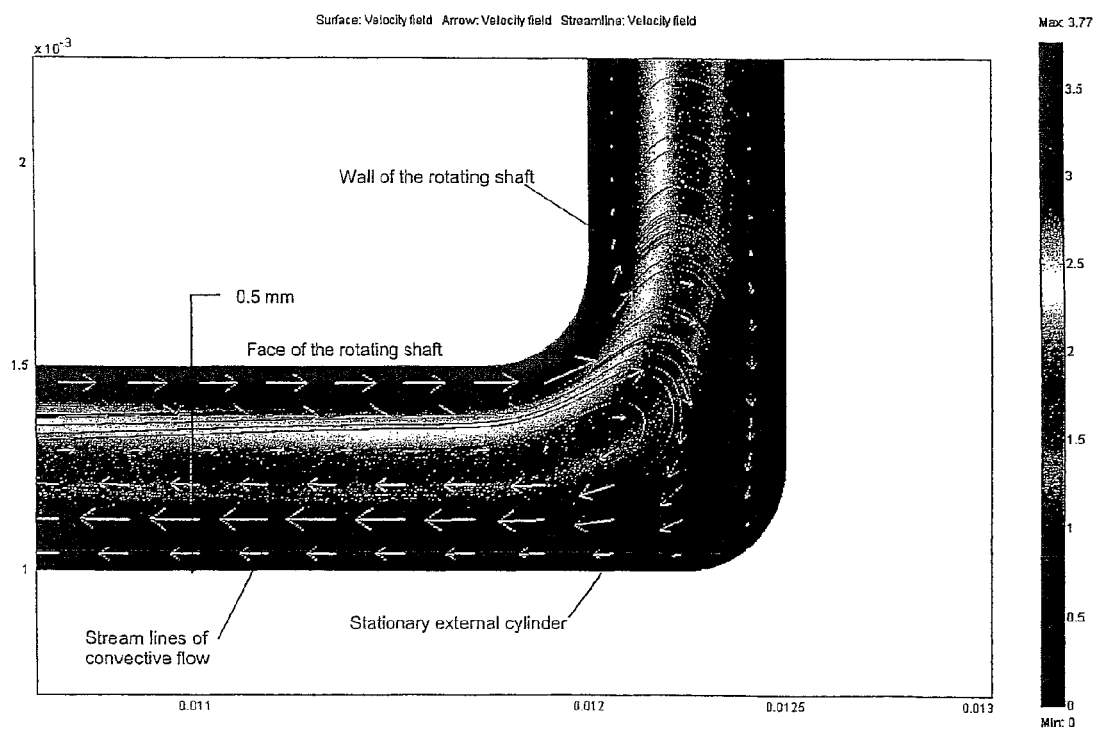
FIG. 5 illustrates a graphical representation of a flow pattern within a fluid film utilizing computational fluid mechanics software.

Referring to FIG. 5 of the drawings, this shows a plot of an estimate of a flow pattern within a fluid film (spun or rotated at 3000 RPM with 0.5 mm thick film) using a computational fluid mechanics software. The total velocity of the fluid is mainly composed of two components; i.e., a dominant tangential and a weak radial vector. The tangential component in cylindrical coordinates is driven by the rotational speed of the shaft, such that the fluid attached to the shaft (or disk) face has the maximum tangential velocity. The fluid that is attached to the stationary external cylinder has a no-slip condition, thus, resulting in a zero velocity. The fluid velocity inbetween the stationary and rotating surface of the structure has a velocity gradient along the axis of rotation (z-axis). The net effect of the tangential velocity is to generate a centrifugal force in the form of body force on the fluid. Since the fluid film attached to the rotating surface of the shaft has the largest centrifugal force with a gradually decreasing centrifugal force nearer the stationary surface, a radial flow component is resultingly generated. The flow is directed radially outwardly at the rotating surface and inwardly at the stationary surface, thereby satisfying the principle of conservation of mass.

Figure 6:
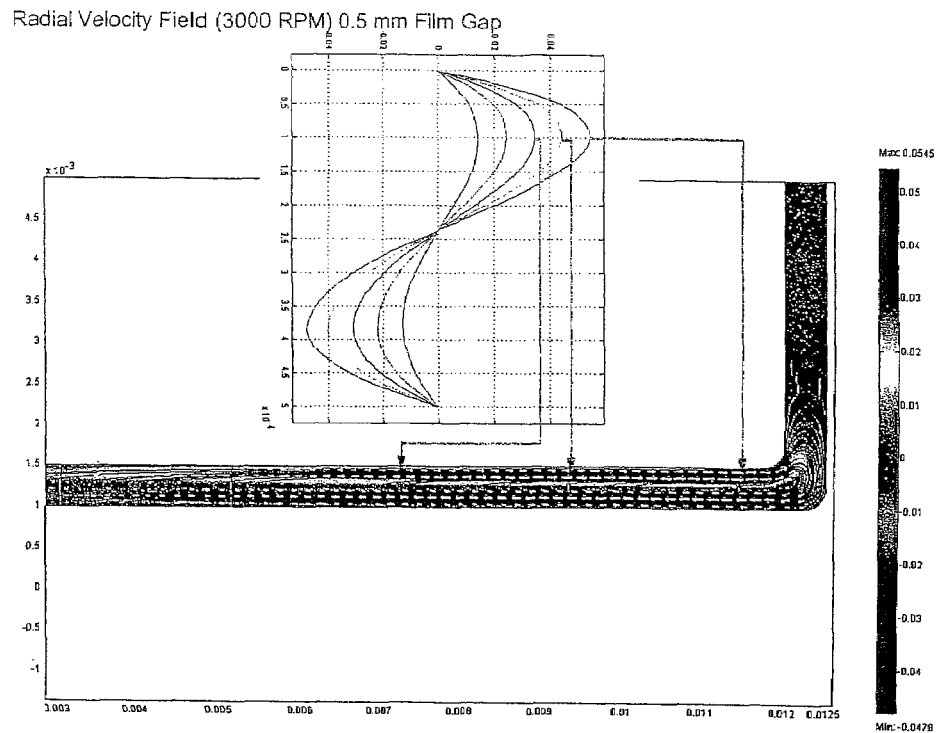
FIG. 6 illustrates graphically a radial velocity crossectional profile at various locations along the radial position of the fluid film of FIG. 5.
Figure 7:
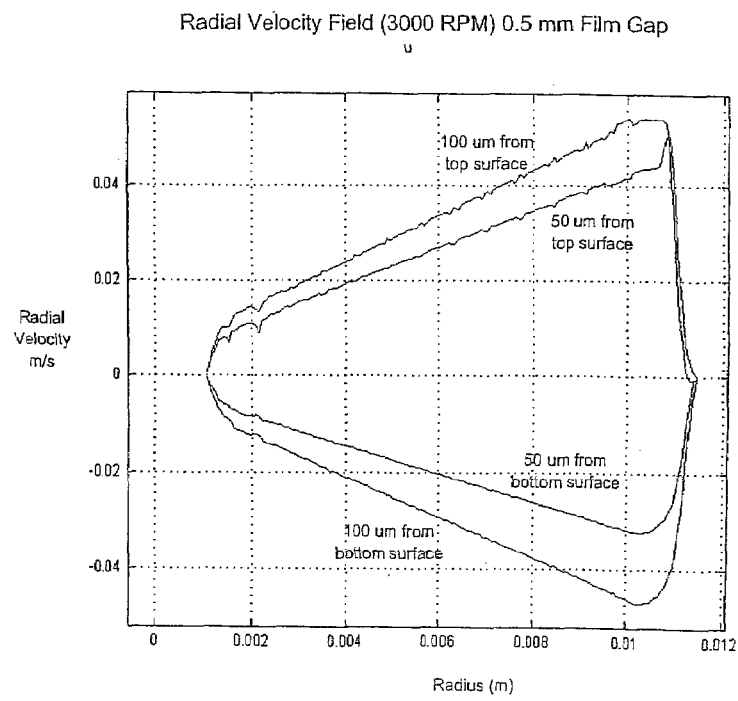
FIG. 7 illustrates graphically a radial velocity profile along the radius for an 0.5 mm wide film gap.

Referring to FIG. 6, this shows a graphical plot of the radial velocity profile, across the fluid thickness, at various locations along the radial position. A progressively increasing velocity profile can be observed with the radial velocity vector reversing its direction near the middle plane. The volume flow rate increases as the radius increases. FIG. 7 shows the effect of Z-distance from the wall, as well as the radius. The further it is away from the wall, the higher is the radial velocity, while proximate the wall, the fluid is stagnant in the radial direction, but rotates along with the shaft in the tangential direction. FIG. 6 indicates that the radial flow is significant in the disk-like face of the rotating shaft, but it is mostly negligible in the gap contained in the sidewall. Since the stagnant fluid can produce high thermal resistance, it is important to reduce the film thickness where conduction can be more advantageous than convection, while in regions where conduction is not as effective, the convection features can be maximized to improve the heat-spreading capability of the fluid film. In order to move the heat flux from the disk-like face to the sidewall, flow direction elements can be added so that fluid traverses the maximum surface area. With these concepts, which are provided by the fluid dynamic simulation, various advantageous embodiments can be developed in this connection to facilitate improved heat transfer phenomena.

Figure 8:
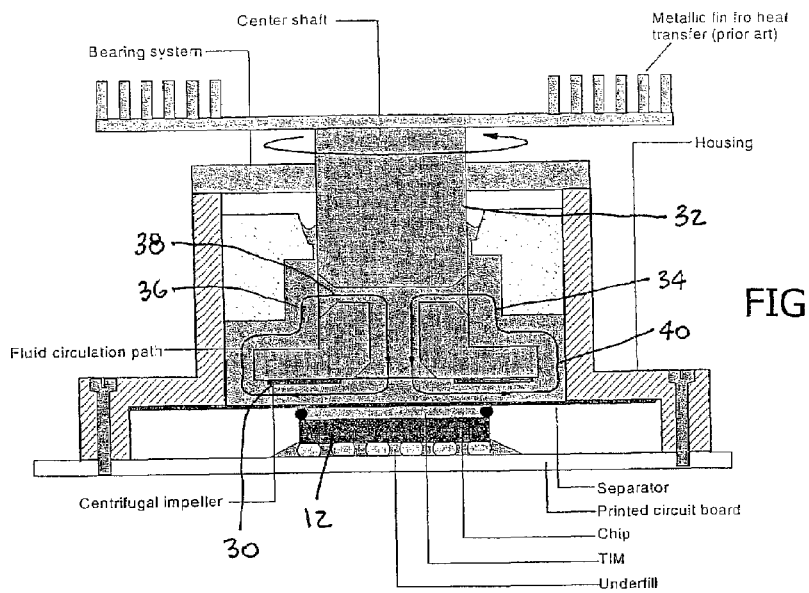
FIG. 8 illustrates diagrammatically a pump structure pursuant to the present invention providing for a radially outward fluid flow driven by impeller action.
Figure 9A:
FIG. 9(a) illustrates generally diagrammatically a self-pumping impeller with helical fluid flow structure.
Figure 9B:
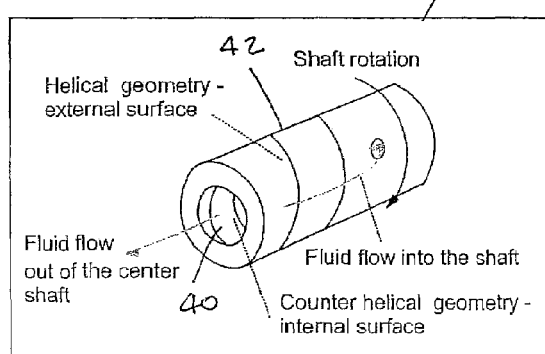
FIG. 9(b) illustrates a perspective representation of a detail of the helical geometry showing the shaft rotation of the structure of FIG. 9(a)
Figure 9C:
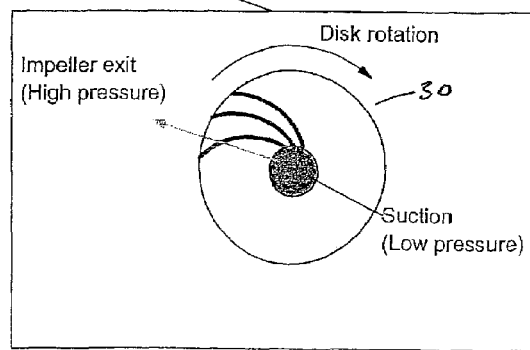
FIG. 9(c) illustrates the impeller exit representative of the disk rotation of the structure of FIG. 9(a)

Fluid circulation, due to a plain or flat shaft face, produces only a limited forced convection; however, by adding an impeller feature to the shaft face, and by providing a return path for the fluid, as illustrated in FIG. 8, there is demonstrated the maximum forced convection effect that can be designed and implemented. By having an (centrifugal) impeller 30 so arranged at the lower face of the disk or shaft 32, there is attained a radially outward flow resultingly augmenting the natural flow direction of the fluid 34 due to centrifugal force. A part of the shaft 32 has axial passageways 36 and radial passageways 38 to complete the fluid path 40. FIGS. 9(a), 9(b) and 9(c) each disclose a representative geometry for an impeller 30, as well as for helical surface structures 42 to help generate pressure in the desired direction of the fluid flow path 40.

Figure 10:
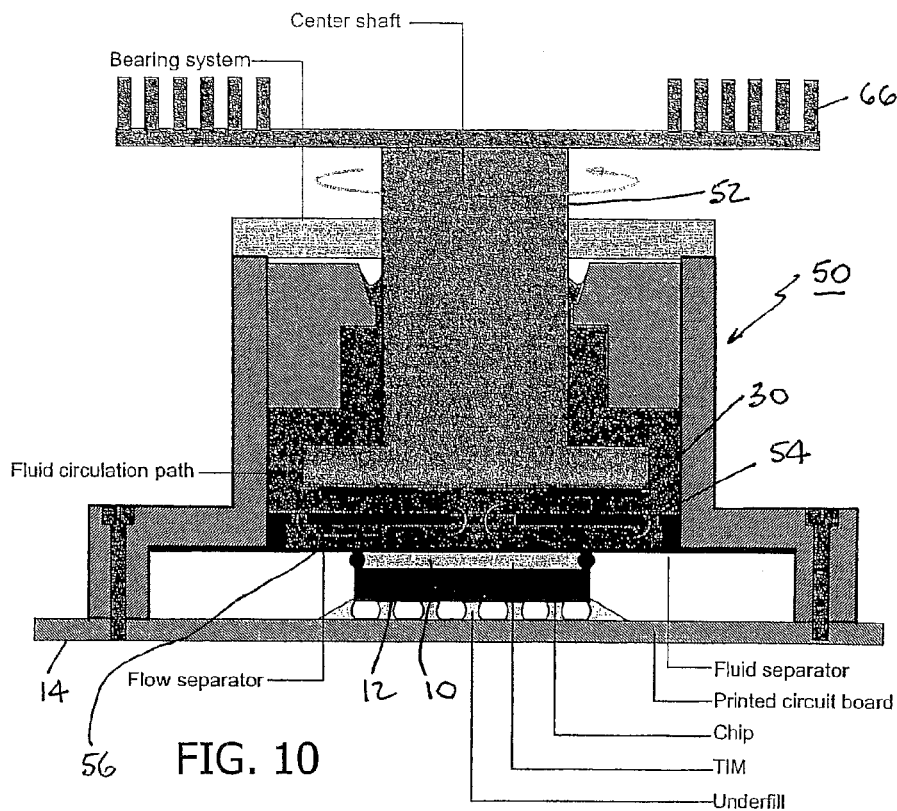
FIG. 10 illustrates a pump structure showing the fluid circulation limited in the disk plane of the shaft pursuant to the invention.
Figure 11:
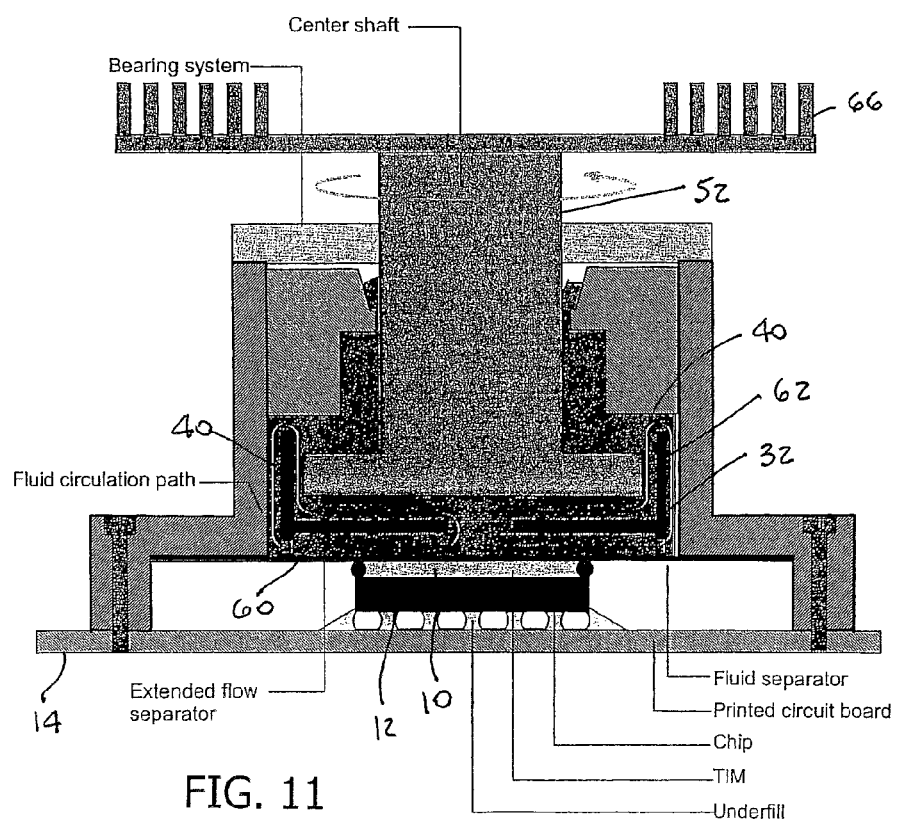
FIG. 11 illustrates a pump structure showing fluid circulation in both a disk plane and along a sidewall of a rotating center shaft pursuant to the invention.

FIG. 10 shows a structure 50 including a solid rotating shaft 52 with a fluid circulation path 54, where said path is confined to the face of the shaft 52, but not along its sides by the provision of a fluid flow-separator 56. The flow separator 56 divides the fluid volume into two fluid flow regions, i.e., a radial outward and a radial inward. The fluid flow separator 56 can also be designed with features (not shown) that would generate turbulent mixing of the fluid in order to enhance the heat transfer capability of the structure. Hereby, the fluid film present in the sidewall is not actively used for cooling in this embodiment. FIG. 11 shows a modified fluid flow separator 60 that extends the radial fluid flow into the sidewall region 62 about the shaft 52, with all other features being identical with the structure of FIG. 10, where the upper end of the shaft 52 supports a heat dissipating finned element 66.

Figure 12:
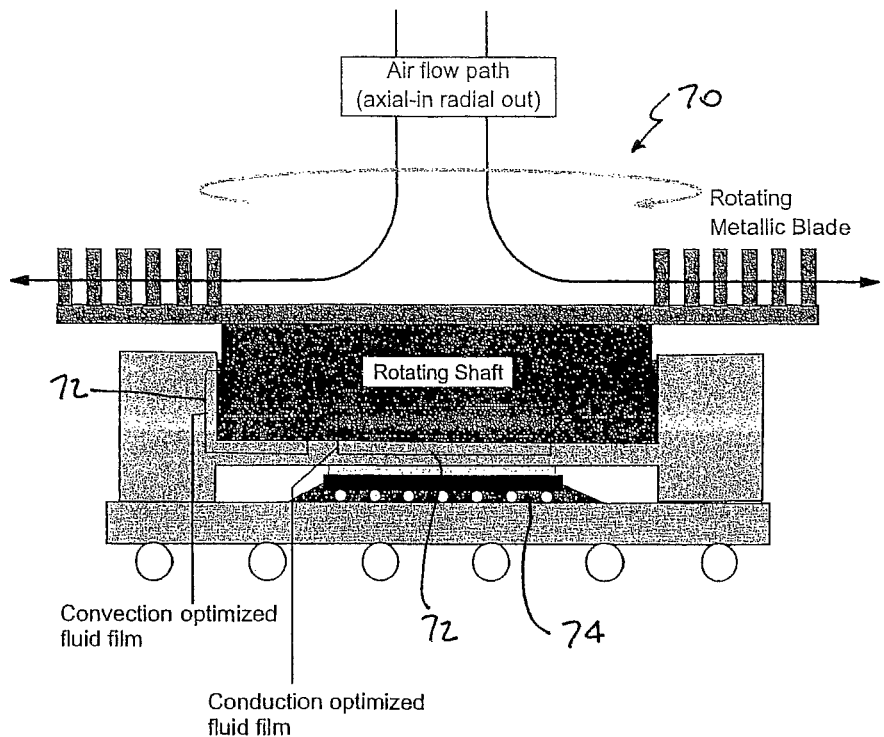
FIG. 12 illustrates a pump structure pursuant to the invention representing a fluid film optimized for conduction and convection heat spreader function.

The film thickness contributes in a non-linear way to the radial convective velocity, whereby FIG. 12 illustrates an embodiment of a structure 70 where the heat conduction through the fluid film 72 is maximized directly above a heat source 74 by maintaining an ultra thin fluid film (less than 50 μm thick) in which the convective velocity is by an order of magnitude lower compared to its tangential velocity. However, as the distance from heat source 74 increases, it is advantageous to maintain a good heat spreading capability, so that in order to increase the radial convective velocity, the fluid film thickness is increased accordingly. The embodiment in FIG. 12 shows how conductive and convective capability can be maximized in a thermal cooling application.

Figure 13:
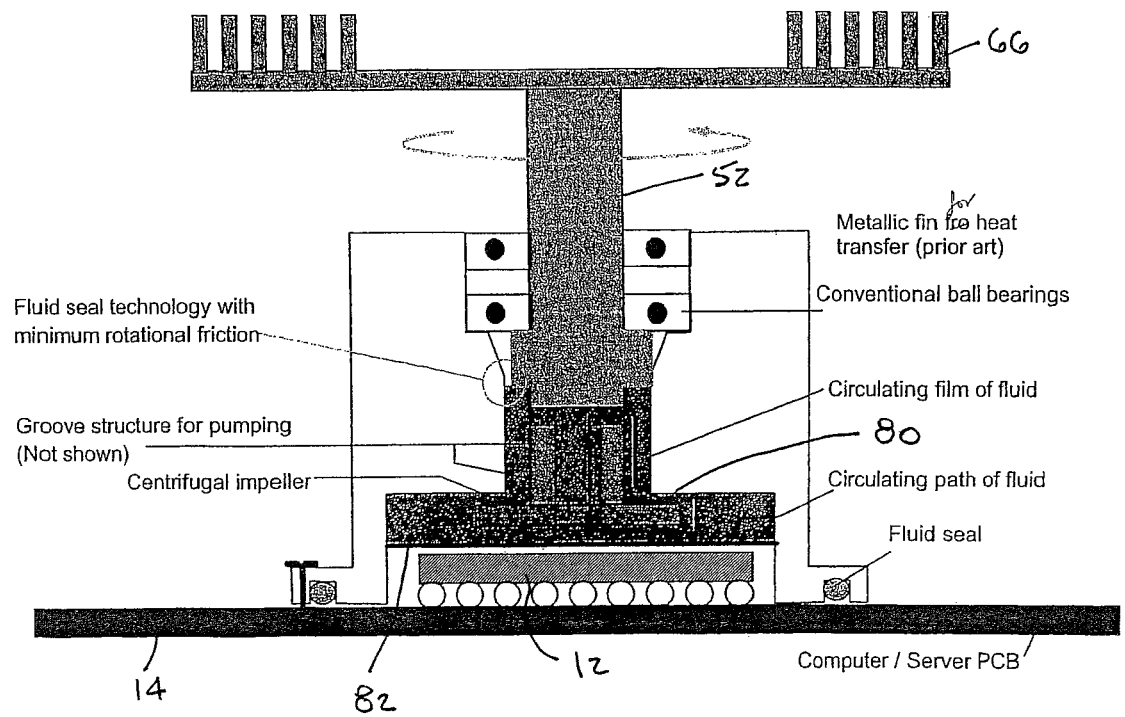
FIG. 13 illustrates a pump structure providing for a radially inward fluid flow driven by both impeller and helical action.
Figure 14:
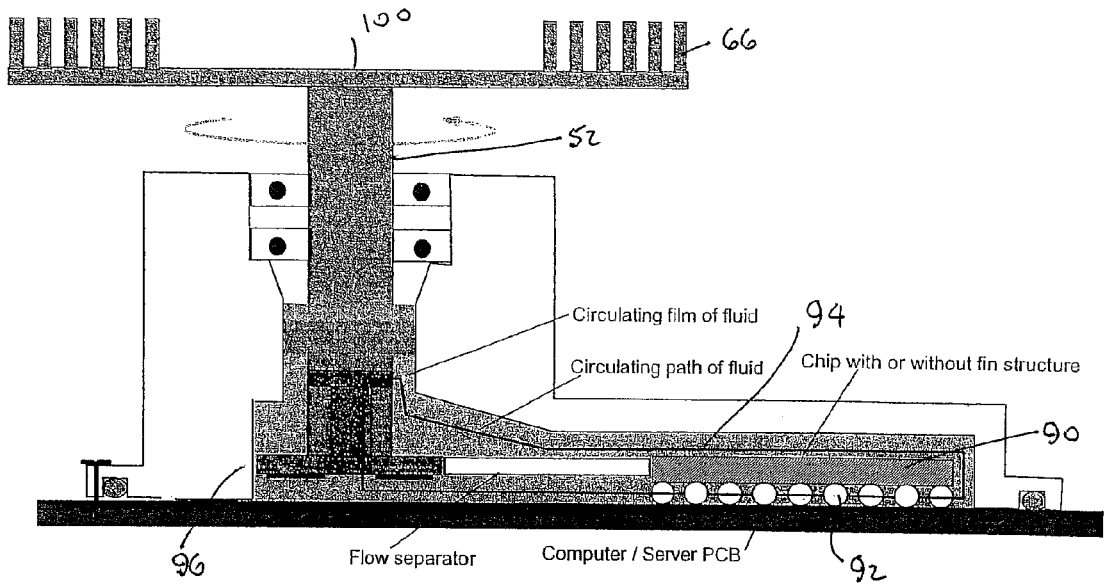
FIG. 14 illustrates a pump structure which discloses a computer chip completely immersed within a fluid flow path providing for an offset pumping action.
Figure 15:
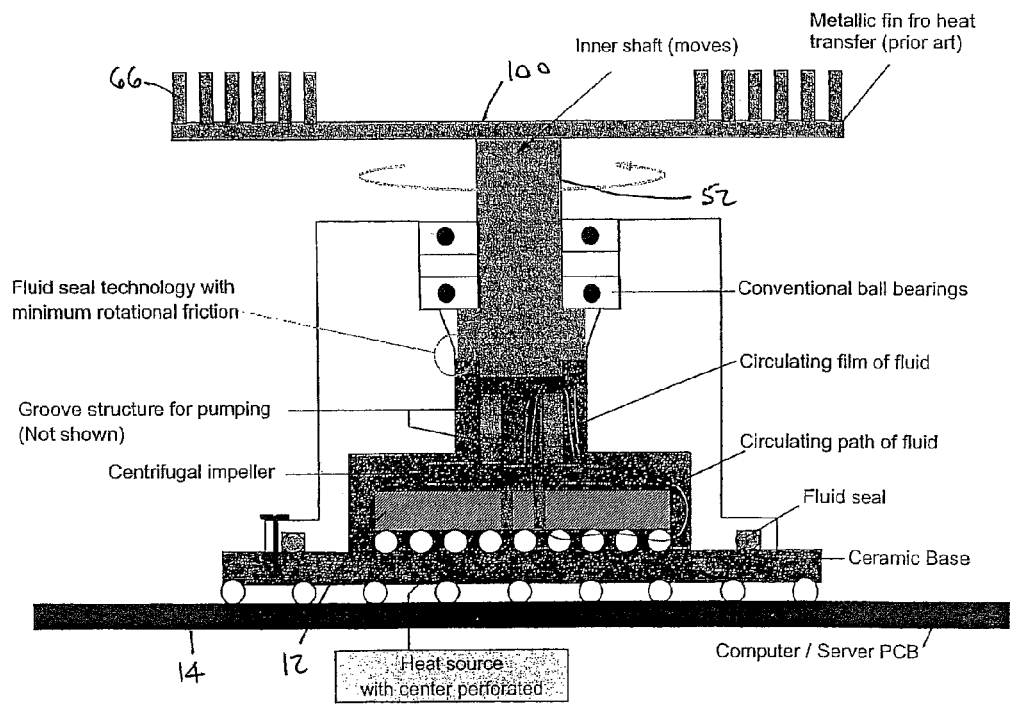
FIG. 15 illustrates a pump structure including a perforated chip which is embedded in a circulating fluid flow.

The remaining embodiments in FIGS. 13 through 18 are primarily variations on flow generation capability with flow paths and heat transfer geometry. Elements and structure components, which are similar to or identical with those disclosed in the preceding embodiments, are designated with the same reference numerals. FIG. 13 shows a reverse flow pattern by having an impeller 80 mounted on the top surface of the rotating disk or shaft 82. FIG. 14 represents a modification where a semiconductor chip 90 along with its solder bumps 92 is immersed in the circulating fluid 94. In order to facilitate the return of the fluid flow, a pressure-generating pump mechanism 96 is offset from the center of the chip 90. It is noted that in this embodiment, the heat transfer to the rotating fin structure 100 is dominated by convection, whereby in order to avoid such a rather complex offset design, the semiconductor chip may require to be imparted a perforation; of which an embodiment is shown in FIG. 15.

Variations in the pattern of the perforation, which can be a single opening 102 in the center of the chip 90 or of a distributed multiple configuration 104, are shown in FIGS. 16(a) and 16(b), respectively. Under this fluid flow condition, the heat transfer surface can further be enhanced by means of radial fins 106, as shown in FIGS. 17 and 18.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A heat sink arrangement for the cooling of electronic devices, said arrangement comprising:

a heat transfer structure having stationary components and containing a fluid media for conducting heat from said electronic devices;

a fluid media pumping structure for circulating said fluid media in a cooling flow path to implement the cooling of said electronic devices, said fluid media pumping structure operating integrally with said fluid media-containing heat transfer structure, said fluid media pumping structure, including a rotatable element comprising a centrifugal impeller located in said cooling flow path, intermediate and rotatable with respect to the stationary components of said heat transfer structure, said cooling flow path of said fluid media extending along an end surface of the rotatable element of said heat transfer structure in proximity with heat-generating components of said electronic devices so as to convectively and conductively remove heat therefrom, and said cooling flow path of said fluid media extends along outer surface portions of said rotatable element to enhance the cooling effect on said heat-generating components; said rotatable component of the heat transfer structure comprising an upstanding shaft member having a heat-dissipating element mounted on the upper end thereof; and wherein said fluid media pumping structure includes a flow separator to direct a convective fluid media current along the surface portions.

2. An arrangement as claimed in claim 1, wherein said heat transfer structure includes an offset portion containing a semiconductor chip immersed in said cooling flow path so as to facilitate a circulatory fluid flow over said semiconductor chip.

3. An arrangement as claimed in claim 2, wherein semiconductor chip has at least one perforation formed therein to facilitate the circulation of said fluid.

4. An arrangement as claimed in claim 3, wherein said semiconductor chip has a plurality of said perforation formed therein.

5. An arrangement as claimed in claim 2, wherein said semiconductor chip has radial fins imparting a flow directing geometry to said fluid media so as to enhance the heat transfer for cooling of said semiconductor chip.

6. A method of providing a heat sink arrangement for the cooling of electronic devices, said method comprising:

providing a heat transfer structure having stationary components and containing a fluid media for conducting heat from said electronic devices; and including a fluid media pumping structure for circulating said liquid media in a cooling flow path to implement the cooling of said electronic devices, said fluid media pumping structure operating integrally with said fluid media-containing heat transfer structure, said fluid media pumping structure comprising locating a rotatable element including a centrifugal impeller in said cooling flow path intermediate, and rotatable with respect to the stationary components of said heat transfer structure, said cooling flow path of said fluid media extending along an end surface of the rotatable element of said heat transfer structure in proximity with heat-generating components of said electronic devices so as to convectively and conductively remove heat therefrom, and said cooling flow path of said fluid media extending along outer surface portions of said rotatable element to enhance the cooling effect on said heat-generating components; said rotatable element of the heat transfer structure comprises an upstanding shaft member having a heat-dissipating element mounted on the upper end thereof and wherein said fluid media pumping structure includes a flow separator to direct a convective fluid media current along the outer surface portions.

7. A method as claimed in claim 6, wherein said heat transfer structure includes an offset portion containing a semiconductor chip immersed in said cooling flow path so as to faciLitate a circulatory fluid flow over said semiconductor chip.

8. A method as claimed in claim 7, wherein semiconductor chip has at least one perforation formed therein to facilitate the circulation of said fluid.

9. A method as claimed in claim 8, wherein said semiconductor chip has a plurality of said perforation formed therein.

10. A method as claimed in claim 7, wherein said semiconductor chip has radial fins imparting a flow directing geometry to said fluid media so as to enhance the heat transfer for cooling of said semiconductor chip.

11. A method as claimed in claim 6, comprising:
   contacting an electronic device and a fluid enclosed in said heat transfer structure for removing heat from said electronic device;
   said heat transfer structure operating integrally with a fluid pumping structure; and
   circulating said fluid through said fluid pumping structure in a cooling flow path extending between said fluid pumping structure and said heat transfer structure to cool said electronic device, wherein a heat-conductive material and at least partially encloses said cooling flow path formed by said fluid.

12. The method of claim 11, wherein said electronic device is disposed within said heat-conductive material in contact with said fluid.

13. The method of claim 11, wherein said electronic device is disposed outside and in contact with said heat-conductive material.

\* \* \* \* \*